United States Patent [19]

Prunella et al.

[11] 4,410,227
[45] Oct. 18, 1983

[54] TRI-STATE CONTACTOR ASSEMBLY FOR ELECTRONIC DEVICE PACKAGE TEST HANDLER

[75] Inventors: Wallace R. Prunella, Sunnyvale; Art W. Kordes, Los Altos, both of Calif.

[73] Assignee: Trigon Industries, Inc., Mountain View, Calif.

[21] Appl. No.: 262,945

[22] Filed: May 8, 1981

[51] Int. Cl.³ .......................................... H01R 13/62
[52] U.S. Cl. ................................. 339/75 M; 209/573; 324/158 F
[58] Field of Search .............. 339/75 R, 75 M, 149 P, 339/150 B, 151 B; 324/158 F; 209/573

[56] References Cited

U.S. PATENT DOCUMENTS

| | | | |
|---|---|---|---|
| 3,715,662 | 2/1973 | Richelmann | 339/75 M |
| 3,727,757 | 4/1973 | Boissicat | 209/573 |
| 3,848,221 | 11/1974 | Lee, Jr. | 324/158 F |
| 3,896,935 | 7/1975 | Hjelle et al. | 209/573 |
| 4,047,780 | 9/1977 | Cedrone | 324/158 F |
| 4,128,174 | 12/1978 | Frisbie et al. | 209/573 |
| 4,234,418 | 11/1980 | Boissicat | 209/573 |
| 4,284,314 | 8/1981 | Lesyk | 339/75 M |

FOREIGN PATENT DOCUMENTS 1934752  1/1971  Fed. Rep. of Germany ... 324/158 F

*Primary Examiner*—John McQuade
*Attorney, Agent, or Firm*—Claude A. S. Hamrick

[57] ABSTRACT

A contactor assembly including two pairs of electrical contactor carrying heads respectively disposed on opposite sides of a track for transporting packaged electronic devices having laterally extending connector legs or pads. One of the heads of each pair includes a stop projection. Electrical actuators and associated mechanical linkages are provided for sequentially moving the heads of each pair toward each other in steps from maximally separated positions to intermediately separated positions wherein the stop projections intrude into the path taken by devices moving along the track and thereby define a device test location, and then to minimally separated positions wherein the contactors of each head engage the connector legs or pads of a packaged device disposed in the test location.

10 Claims, 9 Drawing Figures

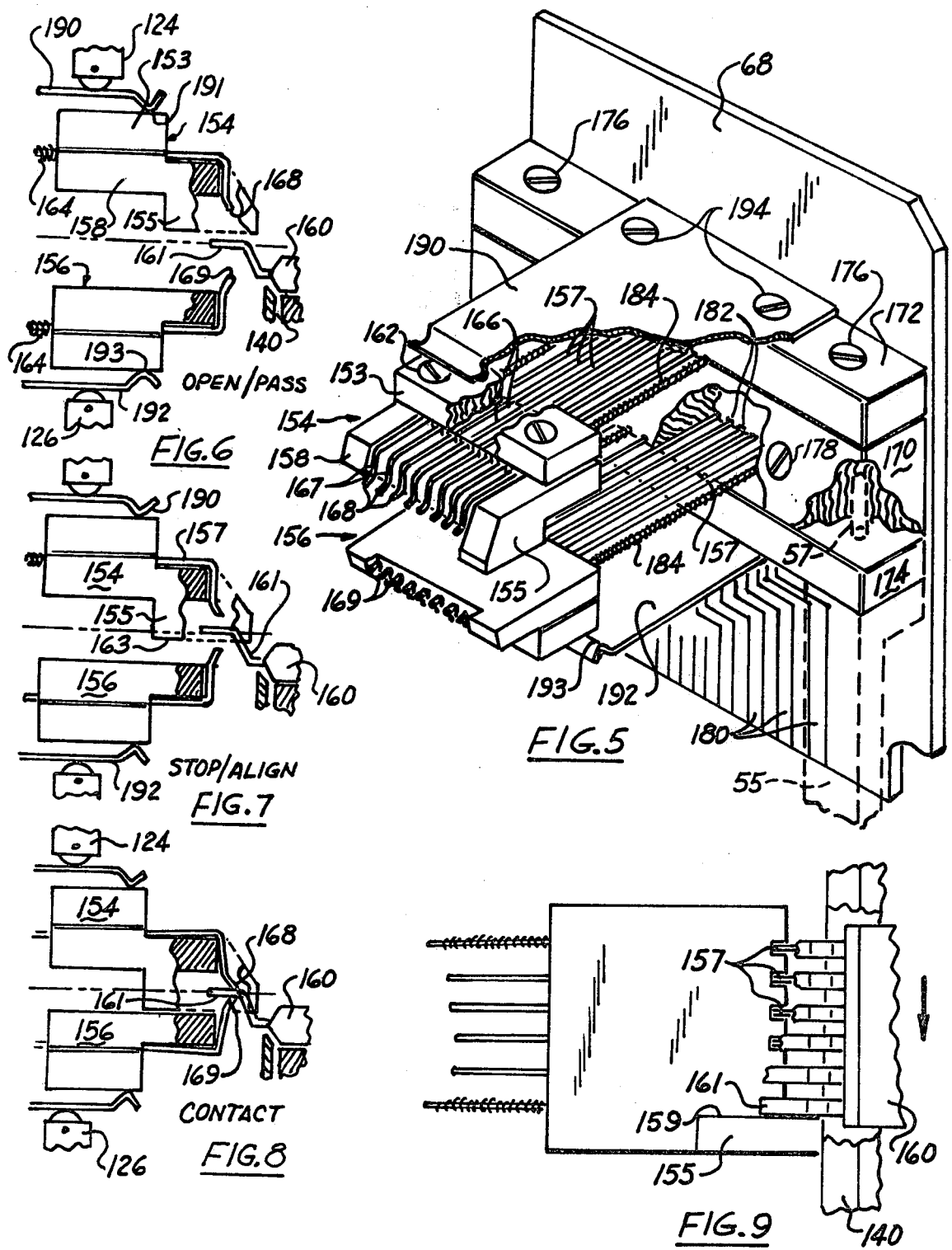

TRI-STATE CONTACTOR ASSEMBLY FOR ELECTRONIC DEVICE PACKAGE TEST HANDLER

BACKGROUND OF THE INVENTION

1. Field of the Invention

The present invention relates generally to electronic component handling and test apparatus and more particularly to a new contactor assembly for facilitating the testing of electronic circuit components contained in protection packages sometimes referred to in the art as SO (small outline) devices or SODIP devices which are variations of the now standard DIP (dual in line packaged) devices.

2. Description of the Prior Art

Although integrated circuit devices have for some time now have been packaged in standardized packages generally known in the industry as DIPs, the desire for package size reduction to increase the compaction of IC devices on a terminal board has led to modifications in the configuration of the package as well as the manner in which the package is electrically connected to a carrying circuit board.

Whereas the standard DIP package has heretofore been attached to a circuit board by extending the legs into connecting apertures formed in the circuit board, attempted reductions in the sizes of both the DIP package and its electrical connecting legs have caused problems with regard to the testing of the devices before installation on a circuit board as well as problems relating to alignment and connection of the several legs of the devices with the conductors formed on the circuit board. As a consequence, alternative DIP configurations are now being devised which are configured to alleviate both the testing and mounting problems.

One such device is now referred to as the SODIP (small outline dual in-line package) device and is configured as illustrated in FIG. 1 of the drawing at 10. The SODIP devices have a smaller packaging body with connector legs 12 which are flared outwardly to form contacting feet 14 which instead of extending into holes in the circuit board 16 merely rest upon and are flow-solder or otherwise electrically connected to the printed circuit conductors 18 of the board. By using this configuration, higher density circuit board lines are also possible since contactor foot sizes as small as 0.020×0.020 inch spaced on 0.050 inch centers are typical. However, in order to test such newly configured devices, contactor assemblies such as are disclosed in the U.S. Pat. Nos. to Claude M. Boissicat, 3,727,757 and 4,234,418, Harold N. Hjelle et al, 3,896,935 and Frisbie et al, 4,128,174 are no longer suitable and must be adapted to engage the leads in a different manner than has heretofore been the practice.

Another problem which has resulted from a reduction of the size of the integrated circuit packages and their associated electrical connectors is that the dimensions of the plastic or ceramic packages often vary relative to the positioning of the connector legs or contact pads by tolerances too large to allow a package end or other package surface to be used as an alignment surface for positioning the package relative to contactor probes. This, of course, requires the provision of new alignment mechanisms.

SUMMARY OF THE PRESENT INVENTION

It is therefore a primary objective of the present invention to provide a novel contactor assembly for use in devices used to handle, sort and test packaged electronic devices.

Another object of the present invention is to provide a contactor assembly of the type described which includes means for positively aligning the connector feet of a SODIP device with contactor probes of the contactor assembly.

Still another object of the present invention is to provide a contactor assembly of the type described having small contactors which provide good Kelvin contact to each connector foot of a SODIP device being tested.

Briefly, a preferred embodiment of the present invention includes a tri-state contactor assembly in which four contactor head units, each having a plurality of contactor probes, are positioned in pairs on both sides of a SODIP device transporting track so that when in a first positional state their corresponding contact probes are in spaced apart facing relationship and define passageways through which the outwardly turned feet of a SODIP device are caused to pass during a test operation. At least one of the heads in each pair is provided with a projection positioned on the downtrack side of the contactor probes and so that when in a second positional state the projection is disposed within the path separating the probes to form a device engaging stop. The probes of the respective heads of each head pair terminate in facing relationship on opposite sides of the passageways so that when actuated into a third positional state, good Kelvin contact is made with each foot portion of the SODIP connectors. The assembly further includes means for sequentially moving the heads from the first tri-state position to the second tri-state position in which the leading legs of a SODIP device encounter the stop surfaces, and thence to the third tri-state position in which the contactor probes are caused to simultaneously engage each leg of the SODIP device.

A primary advantage of the present invention is that it provides a novel contactor assembly which may be integrated into existing DIP handling technology in order to provide a means by which SODIP devices or other similarly packaged devices can be quickly aligned and tested. Another advantage of the present invention is that it provides contact head configurations which insure that the connector legs or other contact surfaces of a tested device are properly aligned with each of the contactor probes and that equal contact pressures are applied to each such leg or surface.

Still other objects and advantages of the present invention will no doubt become apparent to those of ordinary skill in the art after having read the following detailed disclosure of a preferred embodiment which is shown in the several figures of the drawing.

IN THE DRAWING

FIG. 5 is a partially broken perspective view illustrating a contactor head module in accordance with the present invention;

FIGS. 6–8 are partially broken side views illustrating the sequential tri-state operation of a pair of contactor heads in accordance with the present invention; and FIG. 9 is a partially broken bottom plan view further illustrating operation of a contactor head in accordance with the present invention.

DETAILED DESCRIPTION OF THE PREFERRED EMBODIMENT

Figure 1:
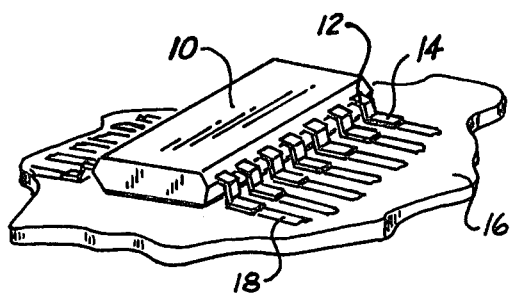
FIG. 1 is a perspective view illustrating a SODIP packaged electronic device.
Figure 2:
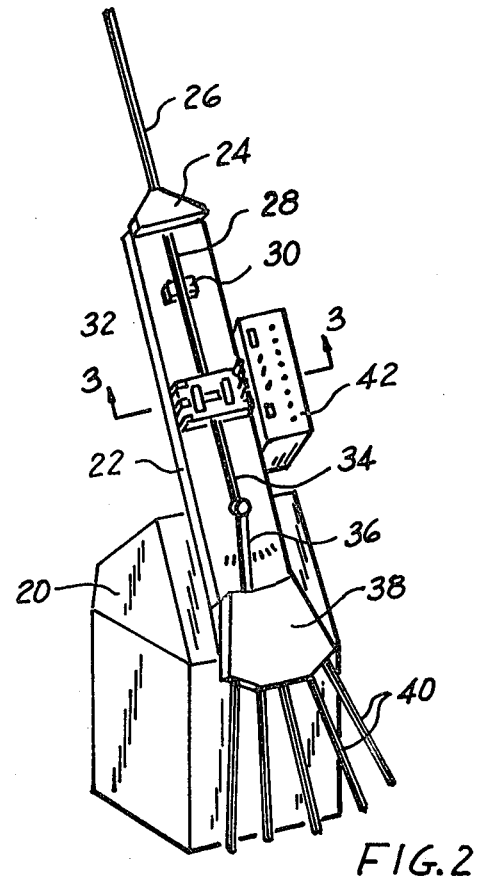
FIG. 2 is a perspective view generally illustrating a test handler incorporating a contactor assembly in accordance with the present invention.

Referring now to FIG. 2 of the drawing, a test handler of the type normally used to test and sort DIPS is shown modified to include a contactor assembly in accordance with the present invention. Generally speaking, the device includes a base 20, a handler chassis 22, means disposed at the top of the chassis 24 for receiving a tubular "stick" 26 containing packaged IC devices to be tested or sorted, a track 28 for transporting DIPS from the stick 26 to a metering device 30 and thence into a contactor assembly 32, an exit track 34, a sorting mechanism 36, a means 38 for holding a plurality of output sticks 40 in place and routing DIPS from the sorter 36 to a selected stick. Suitable test and control electronics are provided in a housing 20 and control panel.

The apparatus may take any of a number of prior art configurations modified primarily only in that the several tracks, tube holders and the contactor assembly are changed to accommodate SODIP devices.

Figure 3:
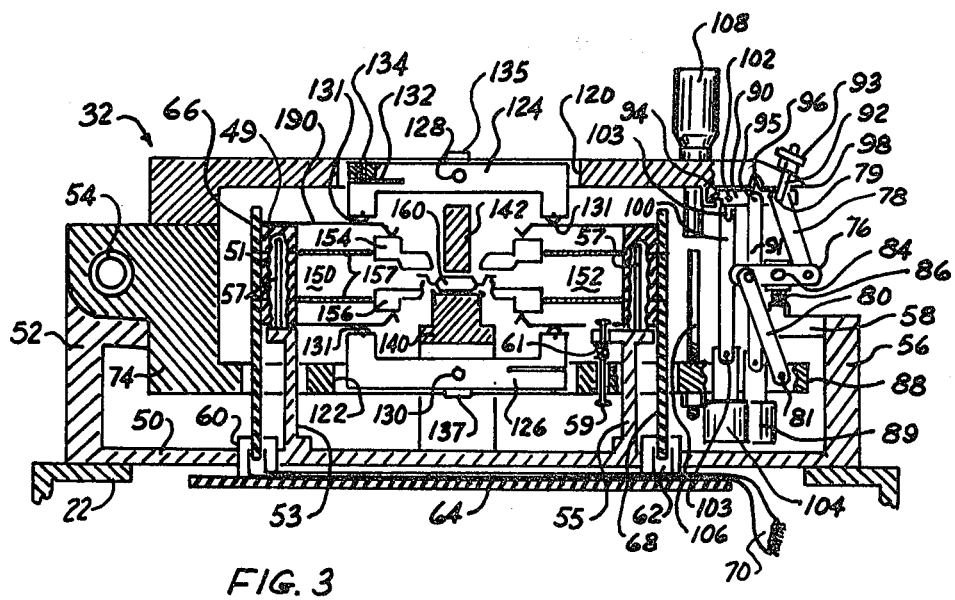
FIG. 3 is a partially broken cross section taken along the line 3—3 of FIG. 2 and showing a contactor assembly in accordance with the present invention.

In FIG. 3 of the drawing, a partially broken cross section taken along the line 3—3 of FIG. 2 is shown to schematically illustrate the various operative components of a contactor assembly 32 in accordance with the present invention. As illustrated, the assembly includes a base 50 which is secured to an instrument chassis 22 in a suitable manner, and includes an upstanding portion 52 on one side having a shaft 54 journalled thereto, and an upstanding portion 56 on the other side having an inwardly extending finger 58 the purpose of which will be explained below. Base 50 also includes a pair of upstanding members 53 and 55 each having a pair of vertically extending alignment pins 57 projecting from tops thereof. Extending through the bottom surface of base 50 at 60 and 62 are connectors to which a printed circuit (PC) board 64 is attached at the bottom and vertically standing PC boards 66 and 68 are likewise attached so as to interconnect their circuits with those of board 64. Connection of board 64 to the device test electronics is made through a suitable connection 70.

Pivotally attached to shaft 54 are an upper actuator plate 72 and a lower actuator plate 74, the distal ends of which are connected together by a bell crank 76 and linkage arms 78 and 80. Bell crank 76 is pivotally attached at its center 84 to a vertically adjustable riser 86. The lower end 88 of linkage arm 80 is pivotally attached to plate 74 at 81, while the upper end of arm 78 is pivotally attached at 79 to a latch block 90 and latch mechanism 92. Latch block 90 has a horizontally extending projection 94 and an upstanding rib 96 which mate with corresponding recepticals formed in plate 72 so that upon the loosening of the clamp nut 93, the latch 92 may be rotated over the end 98 of plate 72 to allow latch block 90 and its appendages to be detached from plate 72. This will free plate 72 to rotate upwardly about shaft 54.

A pair of solenoid actuators 89 and 104 are affixed to the bottom of plate 74 and have their armatures coupled to latch block 90 by means of linkage means 91 and 100. Whereas, the upper end of linkage arm 91 is pivotally affixed to block 90 at 95, the upper end of linkage arm 100 is slot connected to the block by means of a pin 102 and slot 103.

Extending upwardly from plate 74 is an adjustable closure stop 106 which is aligned for engagement with a vernier adjustment mechanism 108 carried by plate 72. In order to permit accurate determination of the lower limit position of plate 74 relative to base 50, an adjustable stop 59 is provided on member 55. A spring 61 resiliently biases plate 74 toward stop 59. Note that since the ends of plates 72 and 74 are coupled together by the bell crank 76 and its associated linkage arms 78 and 80, and since the pivot pin 84 of bell crank 76 is referenced to base 50, in biasing plate 74 downwardly relative to base 50 spring 61 combines with the bell crank linkage to provide a spreading force between the plates 72 and 74, with the maximum spread being determined by stop 59.

Upon actuation of solenoid 104 the rightmost extremities of plates 72 and 74 will be drawn toward each other a predetermined distance determined by the throw of actuator 104; such distance being selected to be less than the separation between stop 106 and the lower end of the vernier adjustment means 108. Upon subsequent actuation of solenoid actuator 89, the ends of plate 72 and 74 will be further closed until the lower end of vernier 108 engages the upper end of stop 106. During the last mentioned operation, pin 102 will slide within the slot 103 in linkage 100.

Upon deactivation of both solenoid actuators the spring 61 will cause bell crank 76 to be rotated counter-clockwise to return the plate extremities to their most wide spread positioning as determined by stop 59.

Disposed within slots 120 and 122 formed in plates 72 and 74 respectively, are bridge-type force applicators 124 and 126 which are pivotally secured to the respective plates by shafts 128 and 130. Applicators 124 and 126 have roller contact means 131 affixed to their lower extremities, and one end of each bridge member includes an adjustment slit 132 and a set screw 134 for allowing incremental variation of the separation of the plane defined by the contact surfaces of rollers 131 and a plane passing parallel thereto through the axis of shaft 128, 130.

A track mechanism including a lower rail 140 and an upper rail 142 are shown passing through the contactor assembly 32. Although not shown in detail it will be appreciated that the track elements 140 and 142 are affixed to chassis 22. In the preferred embodiment these elements may be either clip removable or pivotally disposed so that they can be moved out of the way of the contactor assembly allowing it to be rotated away from the chassis about shaft 54.

Figure 4:
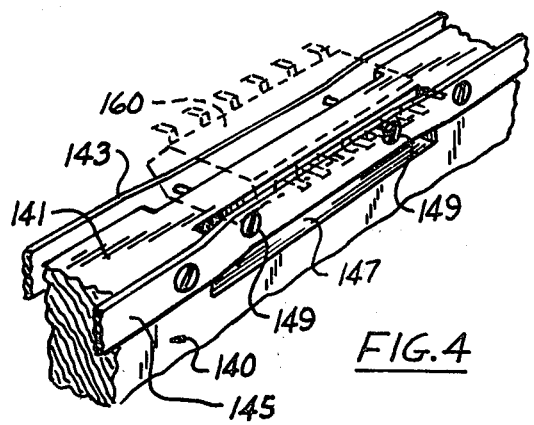
FIG. 4 is a partially broken perspective view illustrating a portion of the track shower in FIG. 3.

The track 140 is trough configured and as illustrated in FIG. 4 includes a base rail 141 with a pair of side rails 143 and 145 affixed thereto. In order to permit accurate alignment of the rail edges relative to the contactor assembly as well as accommodate small variations in the width of the packaged devices to be tested, the sides of rail 141 are undercut as shown at 147 and screws 149 are provided in each side. The tightening of screws 149 allows the rails to be bowed inwardly to modify the track configuration as desired.

Affixed to circuit boards 66 and 68 are modular contactor subassemblies 150 and 152 both of which include upper and lower contact heads 154 and 156. As will be further described below, the subassemblies 150 and 152 are supported by the base members 53 and 55 respectively, and are aligned relative to the base and track by means of the pins 57 which extend into corresponding alignment bores 51 provided in the blocks 49. As further described below, the heads 154 and 156 are cantilever supported above and below their operational positions by means of resilient contact pins 157.

In operation, the heads 154 and 156 are defected downwardly and upwardly respectively, against the supporting forces of pins 157 by means of resilient contact plates 190 which bear against the heads and transmit centering forces communicated thereto by the bridge members 124 and 126. Vertical adjustment, or centering, of the bridge members 124 and 126, and thus the heads 154 and 156, relative to the connector legs of the SODIP device 160 is effected by means of the adjustable slots 132.

Although not clearly shown in the drawing, the leftwardly centilevered projection 58 upon which the adjustment riser 86 is supported is cleared by a corresponding slot (not shown) formed in the rightmost end of plate 74 thereby allowing plate 74 to be rotated upwardly for servicing without interfering with the projection 58. Also not clearly evidenced in the drawing, it will be appreciated that the solenoid actuators 89 and 104 are disposed on opposite sides of the plate 74 so as also not to interfere with clearance of the projection 58.

For purposes of simplicity of illustration, the latch block 90 is configured so that the linkages 78, 91 and 100 are all separately pinned thereto. Alternatively, the several linkages could be disposed to engage a single pin passing through a somewhat differently configured latch block. In such case the actuators 89 and 104 would be aligned with each other and positioned on opposite sides of plate 74.

Turning now to FIG. 5 of the drawing, the contactor modules 150 and 152 will be described in detail. As illustrated, each module is comprised of an upper head 154 and a lower head 156 each including a contact pin separator block 158 and a retainer bar 160 which are fastened together by screws or bolts 162. The blocks 158 and bar 153 are made of a suitable electrically nonconductive material. Heads 154 and 156 are supported in cantilever fashion relative to PC board 68 by means of contact fingers or pins 157 that pass through alignment slots 166 in block 158 and are retained therein by bar 153. The contactor ends 167 of pins 157 are bent downwardly and then outwardly as indicated. The other ends of pins 164 are clamped to an anchor block 170 by means of retainer bars 172 and 174 fastened together by screws 176, and secured to board 68 by screws 178. The conductive traces 180 on the PC board 68 fan out from the 0.050 inch spacing of the contact pins at 182 to the 0.100 inch spacing of standard edgeboard connectors.

The rearmost ends of contactor pins 157 are solder connected to printed circuit leads 180 of the circuit board as illustrated at 182.

In order to insure that the heads 154 and 156 remain in proper position relative to the contactor pins 157, light compression springs 184 are co-axially positioned over at least some of the contact pins 164 and bear against the facing walls of blocks 158 and 170.

Disposed above and below the upper and lower head assemblies 154 and 156 respectively, are spring plates 190 and 192 which are affixed to bars 172 and 174 respectively by screws 194. The distal edges of plates 190 and 192 are deformed to form line contact surfaces 193 for engaging the upper and lower heads 154 and 156 respectively. It will be noted that the block 158 of upper head 154 includes a downwardly projecting portion 155 which is used to form a stop for the leading connector leg of a SODIP device to be tested as will be further described below.

Turning now to FIGS. 6-9 and referring also to FIG. 3, operation of the head assemblies shown generally in FIG. 3 and more specifically in FIG. 5 will be described.

In FIG. 6, heads 154 and 156 are shown in their fully open, first state position (both solenoid 89 and solenoid 104 are inactivated) and the plates 72 and 74 are biased outwardly by spring 61 into their full throw positions as limited by adjustable stop 59. In this position, heads 154 and 156 are held in cantilevered fashion by the contact pins 157 which are sprung slightly toward each other by the contactor plates 190 and 192 which bear firmly against the heads at the contact points 191 and 193 respectively. In such position, the stop projection 155 of head 154, which extends well beneath the contact surfaces 168 of pins 157, is disposed well above the connector feet 161 of a SODIP device 160 allowed to pass along track 140. Note that the contact surfaces 169 of the lower head contact pins are likewise positioned well below the level of connector feet 161.

When solenoid 104 (FIG. 3) is thereafter actuated to drive heads 154 and 156 into their second state position illustrated in FIG. 7, it pulls plates 72 and 74 toward each other causing forces to be transmitted through bridge actuators 124 and 126 deflecting contact plates 190 and 192 inwardly thereby forcing heads 154 and 156 toward each other and into the illustrated second state positions. An such position, the lower edge 163 of stop portion of 155 is positioned beneath the path of connector legs 161 and as the SODIP device 160 slides along track 140 (as further illustrated in FIG. 9), the leading leg 161 thereof will engage stop surface 159 of projection 155 an will cause device 160 to stop thereagainst with its connector feet thus precisely aligned relative to contactor pins 164. Although shown on only one side, it will be appreciated that a similar stop is provided by the corresponding head 154 on the opposite side.

Once the SODIP device is so positioned, solenoid 89 will be actuated to drive the heads 154 and 156 into their third state or fully closed position shown in FIG. 8. Solenoid 89 causes rotation of bell crank 76 about pin 84 (see FIG. 3) thereby causing plates 72 and 74 to be pulled further inwardly until the lower end of vernier adjustor 108 engages stop 106. Such action will of course cause heads 154 and 156 to be moved closer towards each other causing the contact surfaces 168 to engage the top and bottom sides of connector foot 161.

In order to insure good ohmic contact between the contact pins and the connector legs, vernier 108 is preadjusted so as to stop the closing movement of heads 154 and 156 slightly after contact is made between the pin contact surfaces 168, 169 and the legs 161. This causes a slight scrubbing motion to occur between the surfaces thereof as the pins are deflected slightly forward and upwardly due to the slight forward angling of the pin tips. By properly selecting the vernier setting so that the closure force of pins against legs is approximately 36 grams, the tips can be expected to slip about 0.003 inches after contact with the feet 161 and thereby effect the desired scrubbing action.

At this point, testing of the SODIP device can be accomplished, followed by deactivation of solenoids 89 and 104 to allow spring 61 to separate plates 72 and 74, thereby releasing the closing forces applied to heads 154 and 156 by plates 190 and 192, allowing the heads to retract to the fully open position illustrated in FIG. 6. Since projection 155 now clears legs 161, the device 160 will be allowed to drop out of the test position and proceed down track 140 for sorting and collection.

By virtue of the modular construction of the head subassemblies 150 and 152, it will be appreciated that other head subassemblies having greater or lesser numbers of contact pins can be readily and quickly substituted into the apparatus thereby making the device universally applicable to a wide variety of SODIP device configurations. To effect such substitution one merely disengages latch mechanism 92 (see FIG. 3), rotates the plate 72 upwardly, detaches and unplugs the modules 150 and 152 from connectors 60 and 62, replace them with newly configured modules, rotates plate 72 back into position, set the latch 92, adjusts vernier 108 and perhaps centering mechanism 86 if required, and the device is again ready for utilization.

It will also be appreciated from the construction shown in FIG. 5, that in the event a single contactor pin 157 were to become worn or damaged, such pin could be easily removed and replaced without requiring that an entire new head assembly be provided.

Although the present invention has been described above with regard to a single preferred embodiment specifically directed to handling SODIP devices, it is to be understood that the same invention is also applicable to systems used to sort and test other package configurations having laterally extending connector legs or laterally arrayed contact pads. It is also contemplated that after having read the above disclosure, numerous alterations and modifications and modifications thereof will become apparent to those skilled in the art. It is therefore intended that the appended claims be interpreted as covering all such alterations and modifications as fall within the true spirit and scope of the invention.

What is claimed is:

1. A tri-state contactor assembly for making electrical contact to electrical conductors disposed along an edge of an electronic circuit device, comprising:
    means forming a base;
    first head means including first contact pin means extending a first predetermined distance from a first side thereof and means disposed proximate said first pin means and forming a first stop surface extending away from said first side a second predetermined distance greater than said first predetermined distance;
    second head means including second contact pin means extending from a second side thereof;
    means for transporting a circuit device to be tested along a predetermined path to a test position;
    means affixed to said base means for holding said first head means and said second head means in spaced apart relationship above and below said path respectively, with said first side facing said second side and said first pin means aligned with said second pin means; and
    actuator means for causing said first head means and said second head means to move from first state positions of maximum relative separation clear of said path to second state positions of intermediate relative separation wherein said first stop surface extends into said path to engage a circuit device moving along said path and cause said device to stop in said test position, and thence to move to third state positions wherein said first and second pin means are caused to engage the conductors of the device disposed in said test position.

2. A tri-state contactor assembly as recited in claim 1 and further comprising:
    third head means including third contact pin means extending said first predetermined distance from a third side thereof and means disposed proximate said third pin means and forming a second stop surface extending away from said third side said second predetermined distance;
    fourth head means including fourth contact pin means extending from a fourth side thereof;
    means for holding said third head means and said fourth head means in spaced apart relationship above and below said path respectively, on a side of said path opposite the position of said first and second head means and with said third side facing said fourth side and said third pin means aligned with said fourth pin means; and
    wherein said actuator means also causes said third and fourth head means to move from first state positions of maximum relative separation clear of said path to second state positions of intermediate relative separation wherein said second stop surface extends into said path to engage the circuit device moving along said path and cooperates with said first stop surface causing said device to stop in said test position, and thence to move to third state positions wherein said third and fourth pin means engage conductors of the device disposed in said test position.

3. A tri-state contactor assembly as recited in claim 2 wherein said first and second head means are resiliently carried relative to said base and wherein said actuator means includes:
    an upper member disposed above said first head means;
    a lower member disposed below said second head means, said upper and lower members being pivotally connected together and to said base; and
    means for constraining said upper and lower members to rotate in equal and opposite rotational increments about said pivotable connection;
    said upper member including first force applicator means for engaging said first and third head means, and said lower member including second force applicator means for engaging said second and fourth head means such that said head means are caused to move in increments proportional to the angular rotation of said upper and lower members about said pivotable connections.

4. A tri-state contactor assembly as recited in claim 2 wherein said first, second, third and fourth head means are resiliently carried relative to said base and wherein said actuator means includes:
    an upper member disposed above said first and third head means;
    a lower member disposed below said second and fourth head means, said upper and lower members being pivotally connected together and to said base; and means for constraining said upper and lower members to rotate in equal and opposite increments about said pivotable connection;

said upper member including first force applicator means for engaging said first and third head means, and said lower member including second force applicator means for engaging said second and fourth head means such that said head means are caused to move in increments proportional to the angular rotation of said upper and lower members about said pivotable connections.

5. A tri-state contactor assembly as recited in claims 3 or 4 wherein said actuator means further includes first limit stop means for determining the maximum angular separation between said upper and lower members, and second limit stop means for determining the minimum angular separation between said upper and lower members.

6. A tri-state contactor assembly as recited in claim 1 wherein said first and second pin means each include a plurality of elongated conductive elements, and wherein said first and second head means each include means for holding said elements in parallel arrays, one extremity of each array of said elements being rigidly affixed to said base but electrically insulated therefrom, said first and second head means being separated in cantilever fashion relative to said base by said elements.

7. A tri-state contactor assembly as recited in claim 3 wherein said actuator means further includes a first solenoid actuator which when energized causes said upper and lower members to move said first and second head means from said first state positions to said second state positions, and a second solenoid actuator which when energized causes said upper and lower members to move said first and second head means from said second state positions to said third state positions.

8. A tri-state contactor assembly as recited in claim 3 wherein said actuator means further includes a first solenoid actuator which when energized causes said upper and lower members to move said first, second, third and fourth head means from said first state positions to said second state positions, and a second solenoid actuator which when energized causes said upper and lower members to move said first, second, third, and fourth head means from said second state positions to said third state positions.

9. A tri-state contactor assembly as recited in claim 1 wherein said means for transporting includes a rail means having side walls which are selectively deformable laterally relative to said path.

10. A tri-state contactor assembly as recited in claim 4 wherein said first force applicator means includes a first elongated element pivotally connected at its midpoint to said upper member and having means at its respective ends adapted to engage said first and third head means, and wherein said second force applicator means includes a second elongated element pivotally connected at its midpoint to said lower member and having means at its respective ends adapted to engage said second and fourth head means.

* * * * *